(12) United States Patent
Joulia et al.

(10) Patent No.: US 12,195,857 B2
(45) Date of Patent: Jan. 14, 2025

(54) COATED PART COMPRISING A PROTECTIVE COATING BASED ON MAX PHASES

(71) Applicant: SAFRAN, Paris (FR)

(72) Inventors: Aurélien Joulia, Moissy-Cramayel (FR); Pierre Jean Sallot, Moissy-Cramayel (FR)

(73) Assignee: SAFRAN, Paris (FR)

( * ) Notice: Subject to any disclaimer, the term of this patent is extended or adjusted under 35 U.S.C. 154(b) by 331 days.

(21) Appl. No.: 17/639,496

(22) PCT Filed: Aug. 28, 2020

(86) PCT No.: PCT/FR2020/051510
§ 371 (c)(1),
(2) Date: Mar. 1, 2022

(87) PCT Pub. No.: WO2021/044093
PCT Pub. Date: Mar. 11, 2021

(65) Prior Publication Data
US 2022/0325417 A1    Oct. 13, 2022

(30) Foreign Application Priority Data
Sep. 6, 2019 (FR) ...................... 1909805

(51) Int. Cl.
*C23C 28/00* (2006.01)
*C23C 10/38* (2006.01)

(52) U.S. Cl.
CPC ............ *C23C 28/341* (2013.01); *C23C 10/38* (2013.01)

(58) Field of Classification Search
None
See application file for complete search history.

(56) References Cited

U.S. PATENT DOCUMENTS

2010/0047614 A1\* 2/2010 Brinley ..................... C23C 4/06
428/615
2018/0179624 A1\* 6/2018 Lahoda ..................... C23C 4/11

FOREIGN PATENT DOCUMENTS

CN             108147828 A   * 6/2018   ......... C04B 35/5607
WO     WO 2014/193549 A1     12/2014
(Continued)

OTHER PUBLICATIONS

Machine Translation of CN 108147828 A (Year: 2018).*
International Search Report as issued in International Patent Application No. PCT/FR2020/051510, dated Oct. 12, 2020.

*Primary Examiner* — Shamim Ahmed
*Assistant Examiner* — Bradford M Gates
(74) *Attorney, Agent, or Firm* — Pillsbury Winthrop Shaw Pitman LLP

(57) ABSTRACT

A coated part includes a metallic substrate, a thermal barrier comprising a ceramic material and covering the metallic substrate, wherein the coated part further includes a protective coating covering the thermal barrier, the protective coating including, in a first region, a first MAX phase, denoted PZ2, of formula $(Zr_xTi_{1-x})_2AlC$ or a first MAX phase, denoted PC2, of formula $(Cr_xTi_{1-x})_2AlC$ with x non-zero and less than or equal to 1 in the MAX phases PZ2 and PC2, and the protective coating includes, in a second region covering the first region, a second MAX phase of formula $Ti_2AlC$.

19 Claims, 5 Drawing Sheets

(56) References Cited

FOREIGN PATENT DOCUMENTS

| WO | WO 2015/080839 A1 | 6/2015 |
| WO | WO 2018/166748 A1 | 9/2018 |
| WO | WO 2018/184782 A1 | 10/2018 |
| WO | WO 2019/081870 A1 | 5/2019 |

\* cited by examiner

[Fig. 1]
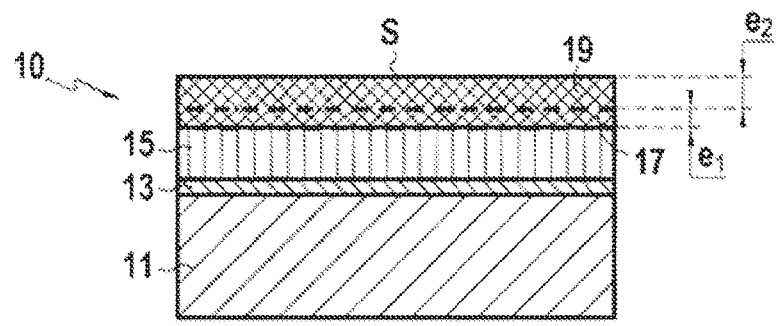
[Fig. 2]
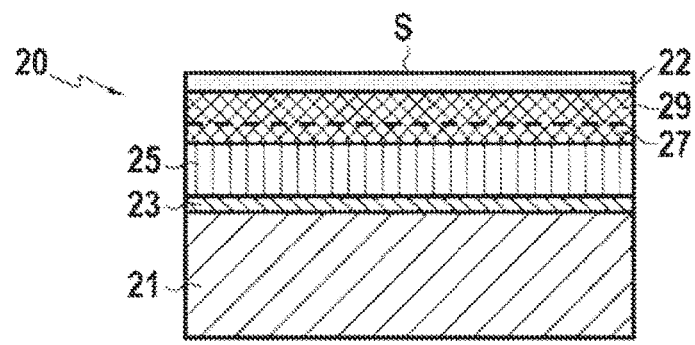
[Fig. 3]
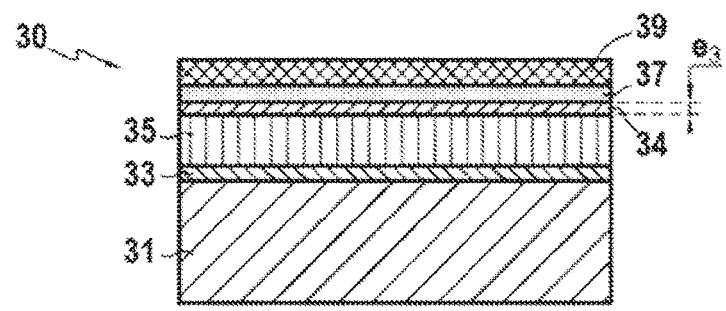

[Fig. 4]
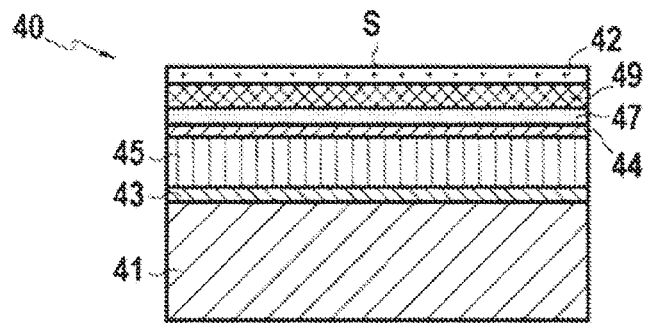
[Fig. 5]
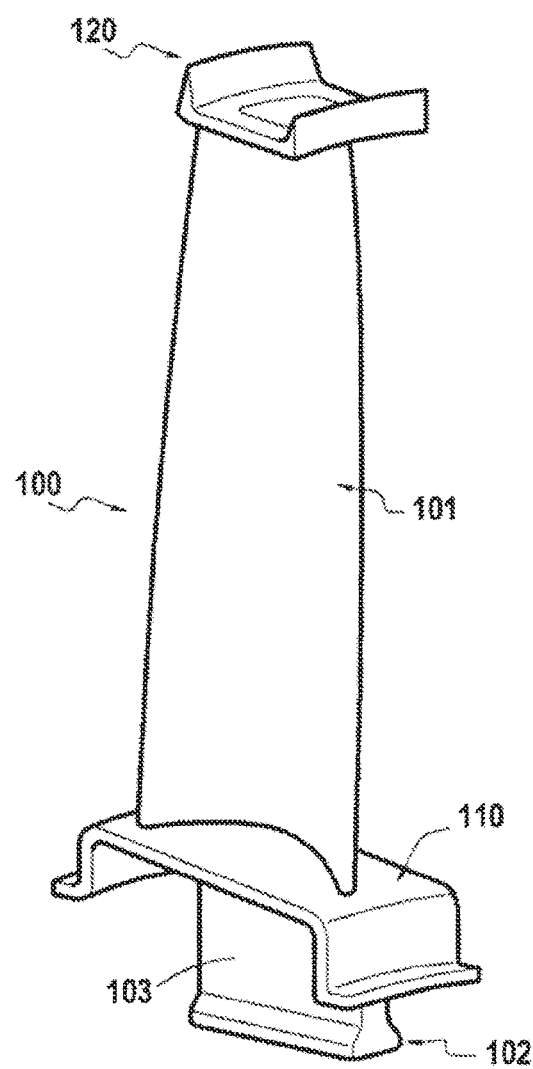

[Fig. 6]
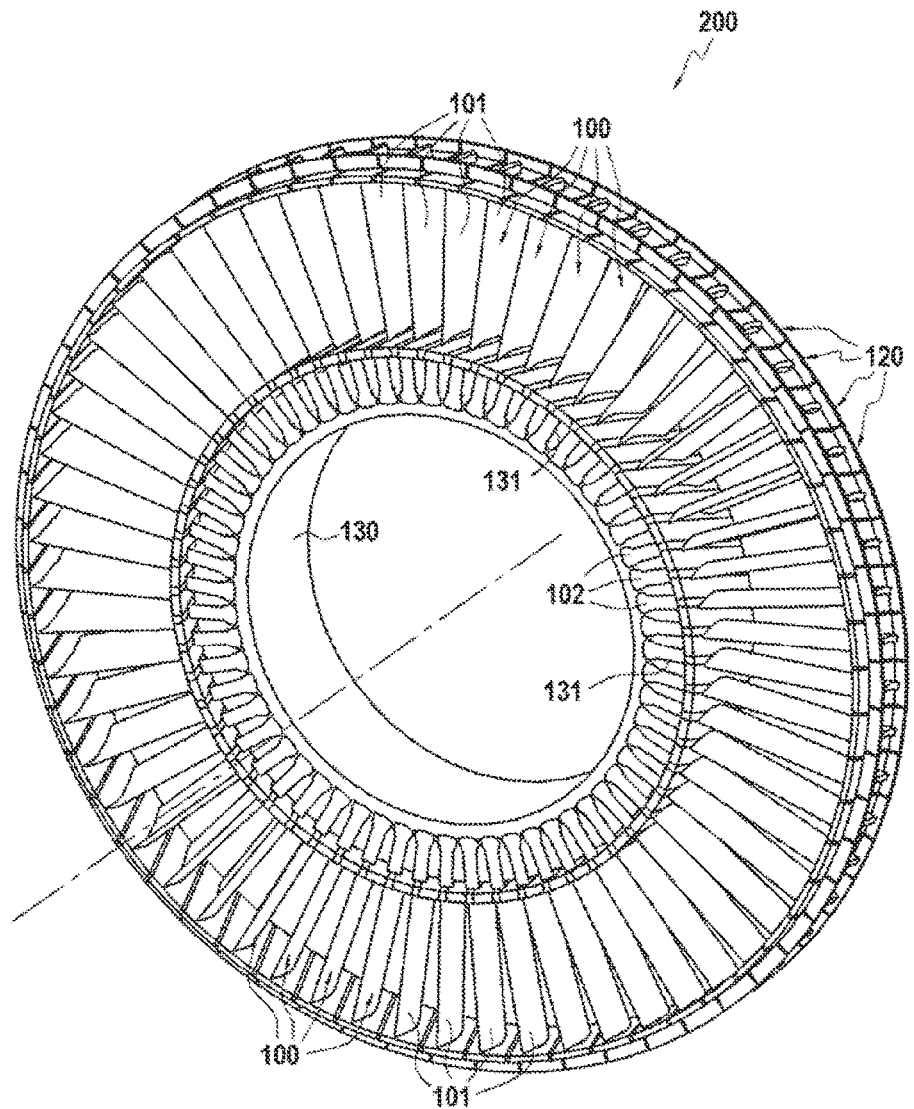
[Fig. 7]
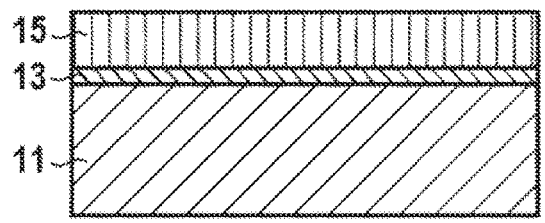

[Fig. 8]
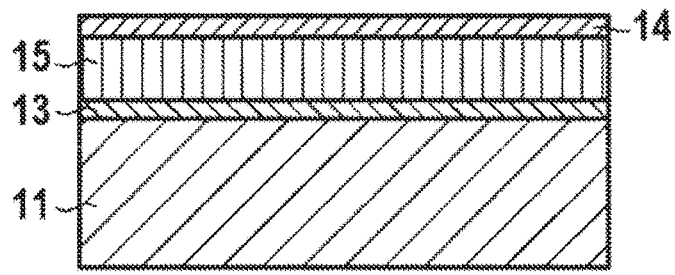
[Fig. 9]
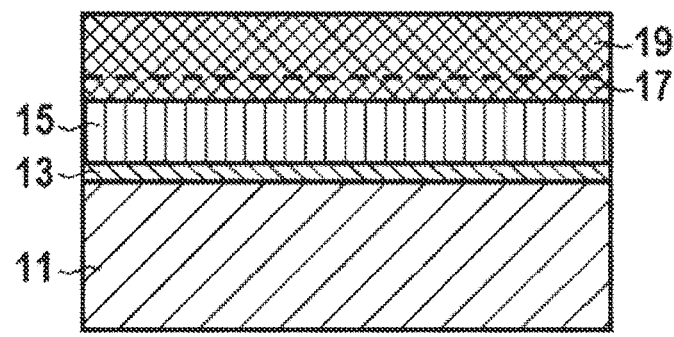
[Fig. 10]
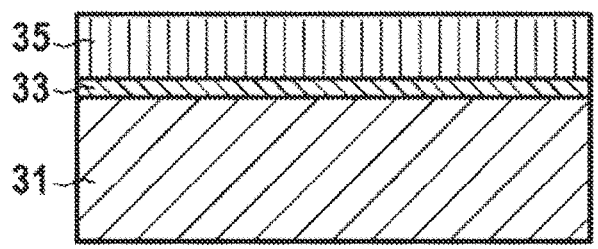

[Fig. 11]
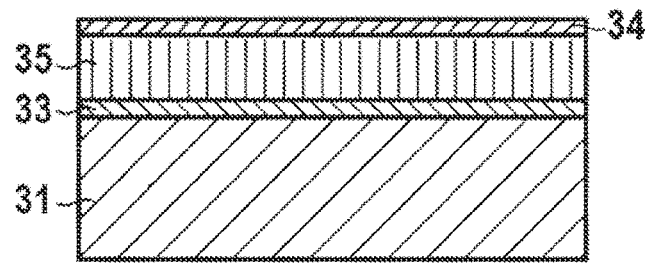
[Fig. 12]
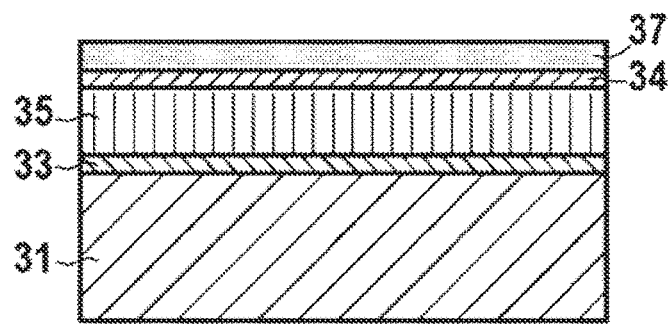
[Fig. 13]
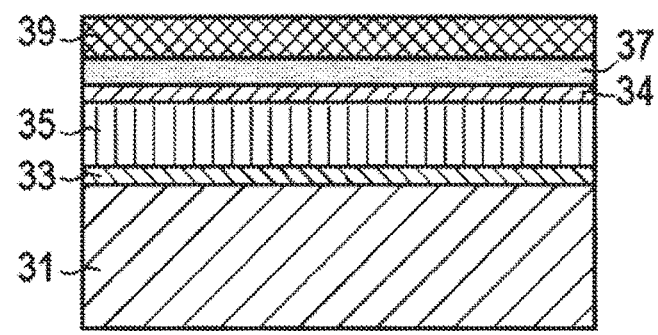

COATED PART COMPRISING A PROTECTIVE COATING BASED ON MAX PHASES

CROSS-REFERENCE TO RELATED APPLICATIONS

This application is the U.S. National Stage of PCT/FR2020/051510, filed Aug. 28, 2020, which in turn claims priority to French patent application number 1909805 filed Sep. 6, 2019. The content of these applications are incorporated herein by reference in their entireties.

TECHNICAL FIELD

The present invention relates to a part comprising a metallic substrate coated with a thermal barrier covered by a protective coating comprising at least two MAX phases of different compositions. The present invention also relates to the method for manufacturing such a part and its use at high temperature and under an oxidising atmosphere.

PRIOR ART

In order to improve their efficiency, high-pressure turbines (HPT) of stationary land systems or for aeronautical propulsion are being subjected to higher and higher temperatures, Under these conditions, the metal components of the HPT need to be more protected in order to keep their surface temperature at a sufficiently low level to guarantee their functional integrity and to omit their oxidation and corrosion by the surrounding atmosphere. In order to respond to this, it is known to use thermal barriers which generally consist of a layer, referred to as the bonding layer, enabling protection against oxidation and corrosion, and which is deposited on the surface of the component, as well as a ceramic layer covering this bonding layer, the primary function of which is to limit the surface temperature of the coated components.

In order to ensure its protective function against oxidation and corrosion and to promote the bonding of the ceramic layer, the bonding layer is pre-oxidised so as to form a dense alumina layer at its surface. This alumina layer is commonly designated by the expression "Thermally Grown Oxide" or "TGO" in the literature. The lifespan of thermal barriers is controlled by the resistance of the stack to thermal cycling, as well as by its resistance to environmental attacks (erosion by solid particles, chemical resistance, corrosion, etc.). In particular, the known systems can degrade when they are exposed to an atmosphere rich in sand particles (rich in silica-type inorganic compounds), or to elements commonly called CMAS (for oxides of "calcium-magnesium aluminosilicate").

More specifically, the infiltration of CMAS in the molten state into the thermal barrier can generally produce a degradation through stiffening of the infiltrated layer leading to a mechanical rupture, and through destabilisation by chemical dissolution of the thermal barrier.

In order to overcome this problem, compositions referred to as anti-CMAS, mainly based on rare earth cations such as rare earth zirconates, for example $Gd_2Zr_2O_7$ or $Nd_2Zr_2O_7$, have been developed by taking advantage of the formation of a sealed barrier layer by chemical reaction with the CMAS. However, these systems can have limitations reducing their efficiency and leading to operational lifespans which can be improved. Indeed, the reactions of CMAS with so-called anti-CMAS materials requires the dissolving of said material in the CMAS in order that it precipitates in phases that are stable at the operating temperature, enabling the infiltration to be blocked. However, these reactions require the penetration of the CMAS over a certain depth of the anti-CMAS coating, which weakens the thermal barrier system from a mechanical point of view. Indeed, the intrinsic toughness of rare earth zirconates ($K_{1C\_Gd2Zr2O7}$=0.5-1.0 MPa·m$^{0.5}$) is very much less than that of yttria partially stabilised zirconia that is typically used in the thermal barrier ($K_{1C\_8YPSZ}$=3-4 MPa·m$^{0.5}$). This can make the rare earth zirconate based ceramic layers sensitive to progressive flaking when this layer is impregnated with CMAS and subjected to thermal cycles or to the phenomenon of erosion.

Hence, it is desirable to have novel solutions for improving the lifespan of thermal barrier coatings.

DISCLOSURE OF THE INVENTION

According to a first embodiment, the invention relates to a coated part comprising:
- a metallic substrate,
- a thermal barrier comprising a ceramic material and covering the metallic substrate,
- characterised in that the coated part further comprises a protective coating covering the thermal barrier, the protective coating comprising, in a first region, a first MAX phase, denoted PZ2, of formula $(Zr_xTi_{1-x})_2AlC$ or a first MAX phase, denoted PC2, of formula $(Cr_xTi_{1-x})_2AlC$ with x non-zero and less than or equal to 1 in the MAX phases PZ2 and PC2, and the protective coating comprising, in a second region covering the first region, a second MAX phase of formula $Ti_2AlC$.

According to a second embodiment, the invention relates to a coated part comprising:
- a metallic substrate,
- a thermal barrier comprising a ceramic material and covering the metallic substrate,
- characterised in that the coated part further comprises a protective coating covering the thermal barrier, the protective coating comprising, in a first region, a first MAX phase, denoted PZ3, of formula $(Zr_xTi_{1-x})_3AlC_2$ or a first MAX phase, denoted PC3, of formula $(Cr_xTi_{1-x})_3AlC_2$ with x non-zero and less than or equal to 1 in the MAX phases PZ3 and PC3, and the protective coating comprising, in a second region covering the first region, a second MAX phase of formula $Ti_3AlC_2$.

The protective coating based on MAX phases described above, forms a layer of alumina ($Al_2O_3$) at its surface when it is subjected to a high temperature in an oxidising environment. This alumina layer makes it possible to increase the resistance to oxidation and corrosion, but also to provide protection against CMAS. Indeed, the alumina layer generated reacts with liquid CMAS to form a dense reactive layer consisting of a mixture mainly of anorthite phases ($CaAl_2Si_2O_8$) and spinel phases ($MgAl_2O_4$), which can prevent the infiltration of the underlying thermal barrier. In addition, the first region comprising a zirconium-based or chromium-based MAX phase present between the second region and the thermal barrier can limit the cross-diffusion between the elements of the thermal barrier and of the second MAX phase. This improves the chemical compatibility between the different elements of the coating of the part. The first region also makes it possible to accommodate mechanical deformations induced by the difference in thermal expansion coefficients between the second MAX phase and the thermal barrier, which also contributes to improving the lifespan of the coating of the hot part.

Thus, the protective coating implemented in the context of the invention can improve the protection of the thermal barrier against CMAS and oxidation. In particular, the protective coating provides a better protection than a single layer of $Ti_2AlC$ or of $Ti_3AlC_2$ deposited directly on the thermal barrier, due to the presence of the first region which improves the chemical compatibility of the assembly and accommodates deformations during operation. The protective coating also has a high toughness, giving it good resistance to thermal cycling, good resistance to erosion and to progressive flaking generated by CMAS impregnated within the protective coating in operation.

In an exemplary embodiment, the thickness of the first region is greater than or equal to 0.5 times the thickness of the second region, preferably greater than or equal to the thickness of the second region.

Such a feature makes it possible to further improve the chemical compatibility and to further accommodate mechanical deformations in operation.

In particular, the ratio [thickness of the first region]/[thickness of the second region] can be between 1 and 5, preferably between 1 and 3.

In an embodiment, the protective coating further comprises an intermediate region located between the first region and the thermal barrier, the intermediate region comprising zirconium or an alloy of zirconium, or chromium or an alloy of chromium. The fact of depositing the zirconium or chromium before the rest of the protective coating, avoids any risk of degradation of the underlying thermal barrier by erosion during the formation of the protective coating when a particle spraying technique is used. The presence of the intermediate region in the coated part after formation of the protective coating also further improves the chemical compatibility between the thermal barrier and the rest of the protective coating.

In the particular case of the second embodiment, the protective coating can further comprise an additional protective layer covering the second region and comprising a MAX phase of formula $Ti_2AlC$.

The addition of this $Ti_2AlC$ protective layer improves the stability of the alumina protective layer formed still further compared to the use of $Ti_3AlC_2$ only. This improves the performances of the part when it is used at a particularly high temperature.

In an embodiment, the metallic substrate is a turbomachine part. In particular, the metallic substrate can be a turbine part. The metallic substrate may be a turbomachine blade, for example a turbine blade, or a nozzle.

The invention also relates to a turbomachine comprising a coated part such as described above. The turbomachine may be an aircraft engine turbomachine or be an industrial turbomachine. Hence, the invention relates, in particular, to an aircraft comprising such a turbomachine or again an industrial facility comprising such a turbomachine.

The invention also relates to a method for manufacturing a coated part according to the first embodiment described above and with x less than 1 in the MAX phases PZ2 and PC2, the method comprising, when the first region comprises the first MAX phase PZ2:
  depositing zirconium or a zirconium alloy on the thermal barrier,
  depositing the second MAX phase of formula $Ti_2AlC$ on the previously deposited zirconium or zirconium alloy, and
  a heat treatment for zirconium diffusion into the second MAX phase of formula $Ti_2AlC$ in order to obtain the coated part, or the method comprising, when the first region comprises the first MAX phase PC2:
  depositing chromium or a chromium alloy on the thermal barrier,
  depositing the second MAX phase of formula $Ti_2AlC$ on the previously deposited chromium or chromium alloy, and
  a heat treatment for chromium diffusion into the second MAX phase of formula $Ti_2AlC$ in order to obtain the coated part.

In this case relating to the first embodiment, the first region results from the diffusion of zirconium or chromium into the $Ti_2AlC$ phase in order to form a solid solution. In this case, x is less than 1, in other words the MAX phases PZ2 and PC2 comprise both zirconium and titanium or chromium and titanium. The diffusion of zirconium or chromium is produced under the effect of a heat treatment. It is noted that this diffusion can be performed during the depositing of the second MAX phase, if this is deposited at high temperature, as is the case during the use of a thermal spraying technique, for example. However, it does not depart from the scope of the invention when this diffusion heat treatment constitutes a separate step performed after the deposition of the second MAX phase, for example in the case where the second MAX phase is deposited at low temperature, for example by cold spraying or by electrophoresis.

The invention also relates to a method for manufacturing a part according to the first embodiment described above and with x less than or equal tot in the MAX phases PZ2 and PC2, the method comprising, when the first region comprises the first MAX phase PZ2:
  depositing a first layer of the first MAX phase PZ2 forming the first region, and
  depositing a second layer of the second MAX phase of formula $Ti_2AlC$ on the first layer, the second layer forming the second region, or the method comprising, when the first region comprises the first MAX phase PC2:
  depositing a first layer of the first MAX phase PC2 forming the first region, and
  depositing a second layer of the second MAX phase of formula $Ti_2AlC$ on the first layer, the second layer forming the second region.

In this case relating to the first embodiment, the materials corresponding to the desired phases are directly deposited in the first and second regions. In other words, the first and second regions are formed without requiring diffusion of zirconium or chromium into the MAX phase $Ti_2AlC$, unlike the case which has just been described. Two distinct layers are formed, corresponding to each of the first and second regions.

The invention also relates to a method for manufacturing a part according to the second embodiment described above and with x less than 1 in the MAX phases PZ3 and PC3, the method comprising, when the first region comprises the first MAX phase PZ3:
  depositing zirconium or a zirconium alloy on the thermal barrier,
  depositing the second MAX phase of formula $Ti_3AlC_2$ on the previously deposited zirconium or zirconium alloy, and a heat treatment for zirconium diffusion into the second MAX phase of formula Ti$_3$AlC$_2$ in order to obtain the coated part, or the method comprising, when the first region comprises the first MAX phase PC3:

depositing chromium or a chromium alloy on the thermal barrier, depositing the second MAX phase of formula Ti$_3$AlC$_2$ on the previously deposited chromium or chromium alloy, and a heat treatment for chromium diffusion into the second MAX phase of formula Ti$_3$AlC$_2$ in order to obtain the coated part.

In this case relating to the second embodiment, the first region results from the diffusion of zirconium or chromium into the Ti$_3$AlC$_2$ phase in order to form a solid solution. In this case, x is less than 1, in other words the MAX phases PZ3 and PC3 comprise both zirconium and titanium or chromium and titanium. This diffusion can be performed during the depositing of the second MAX phase or after this deposition, as indicated above.

The invention also relates to a method for manufacturing a part according to the second embodiment described above and with x less than or equal to 1 in the MAX phases PZ3 and PC3, the method comprising, when the first region comprises the first MAX phase PZ3:

depositing a first layer of the first MAX phase PZ3 forming the first region, and depositing a second layer of the second MAX phase of formula Ti$_3$AlC$_2$ on the first layer, the second layer forming the second region, or the method comprising, when the first region comprises the first MAX phase PC3:

depositing a first layer of the first MAX phase PC3 forming the first region, and depositing a second layer of the second MAX phase of formula Ti$_3$AlC$_2$ on the first layer, the second layer forming the second region.

In this case relating to the second embodiment, the materials corresponding to the desired phases are directly deposited in the first and second regions. In other words, the first and second regions are formed without requiring diffusion of zirconium or chromium into the MAX phase Ti$_3$AlC$_2$, unlike the case which has just been described. Two distinct layers are formed, corresponding to each of the first and second regions.

The invention also relates to a method for using a part such as described above, the method comprising a step of using said part at a temperature greater than or equal to 800° C. in an oxidizing environment.

BRIEF DESCRIPTION OF THE FIGURES

FIG. 1 schematically illustrates a first example of a coated part according to the invention.

FIG. 2 schematically illustrates a second example of a coated part according to the invention.

FIG. 3 schematically illustrates a third example of a coated part according to the invention.

FIG. 4 schematically illustrates a fourth example of a coated part according to the invention.

FIG. 5 is a perspective view of a metallic substrate able to be used in the context of the invention, which constitutes a turbomachine blade.

FIG. 6 is a perspective view of a turbomachine wheel incorporating a plurality of coated parts according to the invention.

FIG. 7 illustrates a first step of a method for manufacturing the part according to the first example illustrated in FIG. 1.

FIG. 8 illustrates a second step of a method for manufacturing the part according to the first example illustrated in FIG. 1.

FIG. 9 illustrates the obtaining of the part according to the first example illustrated in FIG. 1, after diffusion between the deposited elements.

FIG. 10 illustrates a first step of a method for manufacturing the part according to the third example illustrated in FIG. 3.

FIG. 11 illustrates a second step of a method for manufacturing the part according to the third example illustrated in FIG. 3.

FIG. 12 illustrates a third step of a method for manufacturing the part according to the third example illustrated in FIG. 3.

FIG. 13 illustrates a fourth step of a method for manufacturing the part according to the third example illustrated in FIG. 3.

DESCRIPTION OF THE EMBODIMENTS

The structure of several examples of coated parts 10, 20, 30 or 40 according to the invention will be described with reference to FIGS. 1 to 4. These parts 10-40 each comprise a metallic substrate 11, 21, 31 or 41 coated by a bonding layer 13, 23, 33 or 43 itself coated by a ceramic thermal barrier layer 15, 25, 35 or 45.

The metallic substrate 11-41 can be a superalloy, for example a nickel-based or cobalt-based superalloy. The bonding layer 13-43 can contain an alloy MCrAlY, with M designating nickel, cobalt or a nickel-cobalt combination, or a nickel aluminide.

The bonding layer 13-43 can be in contact with the metallic substrate 11-41. The bonding layer 13-43 forms part of a thermal barrier which further comprises the ceramic layer 15-45 covering the bonding layer 13-43. The bonding layer 13-43 is present between the ceramic layer 15-45 and the metallic substrate 11-41. The ceramic layer 15-45 can be in contact with the bonding layer 13-43. The ceramic layer 15-45 can comprise zirconia, yttria stabilised zirconia referred to as "YSZ" or yttria partially stabilised zirconia referred to as "YPSZ" or a rare earth zirconate, such as gadolinium zirconate Gd$_2$Zr$_2$O$_7$. The ceramic layer 15-45 can have a columnar structure. The assembly constituted by the substrate 11-41, the bonding layer 13-43 and the ceramic layer 15-45 is known per se.

FIGS. 1 to 4 represent the case of a thermal barrier consisting of only two layers, with a bonding layer 13-43 and a ceramic layer 15-45, but it does not depart from the scope of the invention when the thermal barrier comprises more than two layers, and for example more than two ceramic layers.

The various examples of coated parts 10-40, which are illustrated in FIGS. 1 to 4, differ in terms of the protective coating implemented.

Whichever the example considered, the protective coating covers the thermal barrier. The protective coating can be in contact with the thermal barrier. The protective coating can define the outer layer of the coating of the part 10-40, in other words the layer furthest from the metallic substrate 11-41.

The protective coating comprises a changing composition changing (i) either between a MAX phase PZ2 or PC2 in the first region 17, 27, 37 or 47 and Ti$_2$AlC in the second region 19, 29, 39 or 49, or (ii) between a MAX phase PZ3 or PC3 in the first region 17-47 and Ti$_3$AlC$_2$ in the second region 19-49. The first region 17-47 is superimposed on the thermal barrier. The thermal barrier is between the metallic substrate 11-41 and the first region 17-47. The first region 17-47 can be in contact with the thermal barrier. In the formulas of the MAX phases PZ2, PC2, PZ3 and PC3, x is non-zero, equal to 1 or less than 1. The first region 17-47 can be in contact with the ceramic layer 15-45 of the thermal barrier. The second region 19-49 is superimposed on the first region 17-47. The first region 17-47 is located between the thermal barrier and the second region 19-49. The first region 17-47 is located between the ceramic layer 15-45 of the thermal barrier and the second region 19-49. The second region 19-49 can be in contact with the first region 17-47. The second region 19-49 is further away from the metallic substrate 11-41 than the first region 17-47.

Whichever example is considered, the thickness of the protective coating can be greater than or equal to 5 µm, for example between 5 µm and 500 µm, preferably between 5 µm and 50 µm. The thickness $e_1$ of the first region 17-47 can be greater than or equal to 0.1 µm, for example between 0.1 µm and 50 µm. The thickness $e_2$ of the second region 19-49 can be greater than or equal to 1 µm, for example between 1 µm and 50 µm. The protective coating can be porous or non-porous. In the case where the protective coating is porous, it can be advantageous to limit its porosity to a value less than or equal to 20% by volume.

The features of the protective coating that are applicable whichever example of the part is considered have just been described. The features specific to each of the examples illustrated in FIGS. 1 to 4 will now be described.

In the case of the part 10 illustrated in FIG. 1, the second region 19 defines the outer surface S of the part 10. In this example, the first region 17 comprises a MAX phase PZ2, PC2, PZ3 or PC3 with x less than 1. Hence, the MAX phase of the first region 17 comprises both titanium and chromium, or titanium and zirconium. In the case of FIG. 1, this MAX phase results from diffusion between deposited elements which results in a protective coating consisting of a single and same layer comprising the first region and the second region.

The example of part 20 illustrated in FIG. 2 only differs from part 10 in that the protective coating further comprises an additional protective layer 22 covering the second region 29 and comprising a MAX phase of formula Ti$_2$AlC and in that the second region 29 comprises a MAX phase Ti$_3$AlC$_2$ and the first region 27 comprises a MAX phase PZ3 or PC3. Here, the additional protective layer 22 defines the outer surface S of the part 20. The additional protective layer 22 can be in contact with the second region 29.

The example of part 30 illustrated in FIG. 3 comprises the first 37 and second 39 regions in the form of distinct layers. As will be repeated below in connection with FIGS. 10 to 13, the forming of the first region does not result here from a diffusion of zirconium or chromium in a MAX phase Ti$_2$AlC or Ti$_3$AlC$_2$, rather the materials corresponding to the desired phases in the first 37 and second 39 regions have been deposited directly. The example of FIG. 3 further comprises an intermediate layer 34 of zirconium or a zirconium alloy, or chromium or a chromium alloy present on the thermal barrier. The intermediate layer 34 is located between the ceramic layer 35 of the thermal barrier and the first region 37. This intermediate layer 34 is deposited first, in order to avoid any risk of degradation of the thermal barrier during the depositing of the layers forming the first 37 and second 39 regions. The thickness $e_3$ of the intermediate layer 34 can be less than or equal to 20 µm, for example between 2 µm and 10 µm.

The example of part 40 illustrated in FIG. 4 only differs from part 30 according to the third example in that the protective coating further comprises an additional protective layer 42 covering the second region 49 and comprising a MAX phase of formula Ti$_2$AlC and in that the second region 49 comprises a MAX phase Ti$_3$AlC$_2$ and the first region 47 comprises a MAX phase PZ3 or PC3. Here, the additional protective layer 42 defines the outer surface S of the part 40. The additional protective layer 42 can be in contact with the second region 49. The part 40 also comprises an intermediate layer 44 having the same properties as the layer 34 described above.

A possible application will now be described for the coated part according to the invention in the context of incorporation in a turbomachine, with reference to FIGS. 5 and 6.

FIG. 5 illustrates a coated turbomachine blade 100 constituting a possible example of a coated part according to the invention. In the example of FIG. 5, the metallic substrate defines a turbomachine blade which comprises an aerofoil 101, a root 102 formed by a portion with the greatest thickness, for example with a bulb-shaped cross-section, extended by a shank 103, an inner platform 110 located between the shank 103 and the aerofoil 101 and an outer platform or shroud 120 in the vicinity of the free end of the aerofoil.

FIG. 6 illustrates the incorporation of the turbomachine blade 100 in a turbomachine wheel 200. FIG. 6 illustrates a turbomachine wheel 200 comprising a hub 130 on which are mounted a plurality of blades 100, each blade 100 having a root 102 formed by a thickest portion, for example with a bulb-shaped cross-section, which is engaged in a corresponding housing 131 arranged on the periphery of the hub 130 and an aerofoil 101. The wheel 200 also includes a plurality of blade shroud elements 120 mounted on each of the blades 100.

FIGS. 1 to 6 which have just been described relate to examples of possible structures for the coated parts according to the invention. The description of FIGS. 7 to 13 which will follow, attempts to describe the aspect relating to the manufacture of such coated parts.

FIGS. 7 to 9 relate to the manufacture of the example of part 10 of FIG. 1. The starting material comprises the metallic substrate 11, the bonding layer 13 and the ceramic layer 15 (FIG. 7). The protective coating is then formed by first depositing a layer 14 of zirconium or a zirconium alloy, or a layer 14 of chromium or a chromium alloy on the ceramic layer 15 (FIG. 8). The layer 14 can be deposited in contact with the ceramic layer 15. A second MAX phase of formula Ti$_2$AlC or Ti$_3$AlC$_2$ is then deposited on the layer 14, Various techniques can be used to deposit the layer 14 and the second MAX phase. A spray technique can be used, for example thermal spraying, or vapour phase deposition, for example physical vapour deposition (PVD). Examples of usable techniques include: cold spray, atmospheric plasma spraying (APS), suspension plasma spraying (SPS), solution precursor plasma spraying (SPPS), powder-route high velocity oxygen fuel spraying (HVOF), powder-route high velocity air fuel spraying (HVAF), liquid-route high velocity suspension flame spray (HVSFS), electron-beam physical vapor deposition (EB-PVD), high power impulse magnetron sputtering (HiPIMS), the sol-gel route or electrophoresis.

As indicated above, when the second MAX phase is deposited at high temperature, as is the case, for example, in a thermal spraying process, the zirconium or chromium of the layer 14 diffuses into the second MAX phase during the step of depositing the latter. The diffusion of the zirconium or chromium into the second MAX phase can be performed by imposing a temperature greater than or equal to 900° C., for example between 900° C. and 1200° C.

The layer 14 has the same nature as the intermediate layer 34 or 44 mentioned above and thus avoids any risk of degradation of the underlying thermal barrier during the step of depositing the protective coating (avoids any risk of erosion of the thermal barrier by sprayed particles). In addition to this, in the particular case of FIG. 1, the layer 14 is also used in the case of the part 10 of FIG. 1 in order to obtain the first region 17 having a mixed MAX phase based on zirconium and titanium, or on chromium and titanium, by diffusion of the deposited elements.

At the end of the diffusion of the zirconium or chromium into the second MAX phase, the part 10 is obtained having a protective coating having the first region 17 and the second region 19 (FIG. 9). The method can be continued by depositing an additional protective layer 22, if this is desired, in order to obtain the part 20 according to FIG. 2.

FIGS. 10 to 13 relate to the case of the part 30 of FIG. 3 for which there is no need to use a phenomenon of diffusion of the deposited elements in order to form the first region 37. The method starts with a starting material comprising metallic substrate 31, bonding layer 33 and ceramic layer 35. The zirconium-based or chromium-based intermediate layer 34 is then deposited on the ceramic layer 35. As indicated above, this intermediate layer 34 makes it possible, in particular, to avoid any risk of degradation of the underlying thermal barrier during the step of depositing the protective coating. Then, the desired materials for constituting the first and second regions are deposited directly on this intermediate layer 34. The techniques mentioned above can be used to deposit each of the layers 34, 37 and 39. According to this example, the zirconium-based or chromium-based intermediate layer 34 is located in the finished coated part obtained after forming the protective coating, Of course, if it is desired, an additional protective layer 42 can be formed.

Once the part is coated, before the first use, a pre-oxidation heat treatment can be performed beforehand at a temperature between 950° C. and 1100° C. in order to form the protective alumina layer. Alternatively, this alumina layer can be formed in situ during the operation in an oxidising environment.

The invention claimed is:

1. A coated part comprising:
a metallic substrate being a nickel-based or cobalt-based superalloy,
a thermal barrier covering the metallic substrate and comprising (a) a bonding layer containing an alloy MCrAlY with M designating nickel, cobalt or a nickel-cobalt combination, or a nickel aluminide and (b) a ceramic layer covering the bonding layer,
wherein the coated part further comprises a protective coating covering the thermal barrier, the protective coating comprising, in a first region, a first MAX phase, denoted PZ2, of formula $(Zr_xTi_{1-x})_2AlC$ or a first MAX phase, denoted PC2, of formula $(Cr_xTi_{1-x})_2AlC$ with x non-zero and less than or equal to 1 in the MAX phases PZ2 and PC2, and the protective coating comprising, in a second region covering the first region, a second MAX phase of formula $Ti_2AlC$.

2. The coated part according to claim 1, wherein a thickness of the first region is greater than or equal to 0.5 times a thickness of the second region.

3. The coated part according to claim 1, wherein the protective coating further comprises an intermediate region located between the first region and the thermal barrier, the intermediate region comprising zirconium or an alloy of zirconium, or chromium or an alloy of chromium.

4. The coated part according to claim 1, wherein the metallic substrate is a turbomachine part.

5. A turbomachine comprising a coated part according to claim 4.

6. A method for manufacturing a coated part according to claim 1, and with x less than 1 in the MAX phases PZ2 and PC2,
the method comprising, when the first region comprises the first MAX phase PZ2:
depositing zirconium or a zirconium alloy on the thermal barrier, the deposit being made by a spray technique, by a vapour phase deposition technique, by sol-gel route or electrophoresis,
depositing the second MAX phase of formula $Ti_2AlC$ on the previously deposited zirconium or zirconium alloy, the deposit being made by a spray technique, by a vapour phase deposition technique, by sol-gel route or electrophoresis, and
a heat treatment for zirconium diffusion into the second MAX phase of formula $Ti_2AlC$ by imposing a temperature greater than or equal to 900° C. in order to obtain the coated part,
or the method comprising, when the first region comprises the first MAX phase PC2:
depositing chromium or a chromium alloy on the thermal barrier, the deposit being made by a spray technique, by a vapour phase deposition technique, by sol-gel route or electrophoresis,
depositing the second MAX phase of formula $Ti_2AlC$ on the previously deposited chromium or chromium alloy, the deposit being made by a spray technique, by a vapour phase deposition technique, by sol-gel route or electrophoresis, and
a heat treatment for chromium diffusion into the second MAX phase of formula $Ti_2AlC$ by imposing a temperature greater than or equal to 900° C. in order to obtain the coated part.

7. A method for manufacturing a part according to claim 1, and with x less than or equal to 1 in the MAX phases PZ2 and PC2,
the method comprising, when the first region comprises the first MAX phase PZ2:
depositing a first layer of the first MAX phase PZ2 forming the first region, the deposit being made by a spray technique, by a vapour phase deposition technique, by sol-gel route or electrophoresis, and
depositing a second layer of the second MAX phase of formula $Ti_2AlC$ on the first layer, the second layer forming the second region, the deposit being made by a spray technique, by a vapour phase deposition technique, by sol-gel route or electrophoresis,
or the method comprising, when the first region comprises the first MAX phase PC2:
depositing a first layer of the first MAX phase PC2 forming the first region, the deposit being made by a spray technique, by a vapour phase deposition technique, by sol-gel route or electrophoresis, and
depositing a second layer of the second MAX phase of formula $Ti_2AlC$ on the first layer, the second layer forming the second region, the deposit being made by a spray technique, by a vapour phase deposition technique, by sol-gel route or electrophoresis.

8. A method for using a part according to claim 1, the method comprising a step of using said part at a temperature greater than or equal to 800° C. in an oxidizing environment.

9. A coated part comprising:
a metallic substrate being a nickel-based or cobalt-based superalloy,
a thermal barrier covering the metallic substrate and comprising (a) a bonding layer containing an alloy MCrAlY with M designating nickel, cobalt or a nickel-cobalt combination, or a nickel aluminide and (b) a ceramic layer covering the bonding layer,
wherein the coated part further comprises a protective coating covering the thermal barrier, the protective coating comprising, in a first region, a first MAX phase, denoted PZ3, of formula $(Zr_xTi_{1-x})_3AlC_2$ or a first MAX phase, denoted PC3, of formula $(Cr_xTi_{1-x})_3AlC_2$ with x non-zero and less than or equal to 1 in the MAX phases PZ3 and PC3, and the protective coating comprising, in a second region covering the first region, a second MAX phase of formula $Ti_3AlC_2$.

10. The coated part according to claim 9, wherein the protective coating further comprises an additional protective layer covering the second region and comprising a MAX phase of formula $Ti_2AlC$.

11. The coated part according to claim 9, wherein the thickness of the first region is greater than or equal to 0.5 times the thickness of the second region.

12. The coated part according to claim 9, wherein the protective coating further comprises an intermediate region located between the first region and the thermal barrier, the intermediate region comprising zirconium or an alloy of zirconium, or chromium or an alloy of chromium.

13. The coated part according to claim 9, wherein the metallic substrate is a turbomachine part.

14. A turbomachine comprising a coated part according to claim 13.

15. A method for manufacturing a coated part according to claim 9, and with x less than 1 in the MAX phases PZ3 and PC3,
the method comprising, when the first region comprises the first MAX phase PZ3:
depositing zirconium or a zirconium alloy on the thermal barrier, the deposit being made by a spray technique, by a vapour phase deposition technique, by sol-gel route or electrophoresis,
depositing the second MAX phase of formula $Ti_3AlC_2$ on the previously deposited zirconium or zirconium alloy, the deposit being made by a spray technique, by a vapour phase deposition technique, by sol-gel route or electrophoresis, and
a heat treatment for zirconium diffusion into the second MAX phase of formula $Ti_3AlC_2$ by imposing a temperature greater than or equal to 900° C. in order to obtain the coated part,
or the method comprising, when the first region comprises the first MAX phase PC3:
depositing chromium or a chromium alloy on the thermal barrier, the deposit being made by a spray technique, by a vapour phase deposition technique, by sol-gel route or electrophoresis,
depositing the second MAX phase of formula $Ti_3AlC_2$ on the previously deposited chromium or chromium alloy, the deposit being made by a spray technique, by a vapour phase deposition technique, by sol-gel route or electrophoresis, and
a heat treatment for chromium diffusion into the second MAX phase of formula $Ti_3AlC_2$ by imposing a temperature greater than or equal to 900° C. in order to obtain the coated part.

16. A method for manufacturing a coated part according to claim 9, and with x less than or equal to 1 in the MAX phases PZ3 and PC3,
the method comprising, when the first region comprises the first MAX phase PZ3:
depositing a first layer of the first MAX phase PZ3 forming the first region, the deposit being made by a spray technique, by a vapour phase deposition technique, by sol-gel route or electrophoresis, and
depositing a second layer of the second MAX phase of formula $Ti_3AlC_2$ on the first layer, the second layer forming the second region, the deposit being made by a spray technique, by a vapour phase deposition technique, by sol-gel route or electrophoresis,
or the method comprising, when the first region comprises the first MAX phase PC3:
depositing a first layer of the first MAX phase PC3 forming the first region, the deposit being made by a spray technique, by a vapour phase deposition technique, by sol-gel route or electrophoresis, and
depositing a second layer of the second MAX phase of formula $Ti_3AlC_2$ on the first layer, the second layer forming the second region, the deposit being made by a spray technique, by a vapour phase deposition technique, by sol-gel route or electrophoresis.

17. A method for using a part according to claim 9, the method comprising a step of using said part at a temperature greater than or equal to 800° C. in an oxidizing environment.

18. A method for manufacturing a coated part comprising a metallic substrate,
a thermal barrier comprising a ceramic material and covering the metallic substrate, wherein the coated part further comprises a protective coating covering the thermal barrier, the protective coating comprising, in a first region, a first MAX phase, denoted PZ2, of formula $(Zr_xTi_{1-x})_2AlC$ or a first MAX phase, denoted PC2, of formula $(Cr_xTi_{1-x})_2AlC$ with x non-zero and less than or equal to 1 in the MAX phases PZ2 and PC2, and the protective coating comprising, in a second region covering the first region, a second MAX phase of formula $Ti_2AlC$ and with x less than 1 in the MAX phases PZ2 and PC2,
the method comprising, when the first region comprises the first MAX phase PZ2:
depositing zirconium or a zirconium alloy on the thermal barrier, the deposit being made by a spray technique, by a vapour phase deposition technique, by sol-gel route or electrophoresis,
depositing the second MAX phase of formula $Ti_2AlC$ on the previously deposited zirconium or zirconium alloy, the deposit being made by a spray technique, by a vapour phase deposition technique, by sol-gel route or electrophoresis, and
a heat treatment for zirconium diffusion into the second MAX phase of formula $Ti_2AlC$ by imposing a temperature greater than or equal to 900° C. in order to obtain the coated part,
or the method comprising, when the first region comprises the first MAX phase PC2:
depositing chromium or a chromium alloy on the thermal barrier, the deposit being made by a spray technique, by a vapour phase deposition technique, by sol-gel route or electrophoresis, depositing the second MAX phase of formula $Ti_2AlC$ on the previously deposited chromium or chromium alloy, the deposit being made by a spray technique, by a vapour phase deposition technique, by sol-gel route or electrophoresis, and a heat treatment for chromium diffusion into the second MAX phase of formula $Ti_2AlC$ by imposing a temperature greater than or equal to 900° C. in order to obtain the coated part.

19. A method for manufacturing a coated part, comprising a metallic substrate, a thermal barrier comprising a ceramic material and covering the metallic substrate, wherein the coated part further comprises a protective coating covering the thermal barrier, the protective coating comprising, in a first region, a first MAX phase, denoted PZ3, of formula $(Zr_xTi_{1-x})_3AlC_2$ or a first MAX phase, denoted PC3, of formula $(Cr_xTi_{1-x})_3AlC_2$ with x non-zero and less than or equal to 1 in the MAX phases PZ3 and PC3, and the protective coating comprising, in a second region covering the first region, a second MAX phase of formula $Ti_3AlC_2$, the method comprising, when the first region comprises the first MAX phase PZ3:

depositing zirconium or a zirconium alloy on the thermal barrier, the deposit being made by a spray technique, by a vapour phase deposition technique, by sol-gel route or electrophoresis, depositing the second MAX phase of formula $Ti_3AlC_2$ on the previously deposited zirconium or zirconium alloy, the deposit being made by a spray technique, by a vapour phase deposition technique, by sol-gel route or electrophoresis, and a heat treatment for zirconium diffusion into the second MAX phase of formula $Ti_3AlC_2$ by imposing a temperature greater than or equal to 900° C. in order to obtain the coated part, or the method comprising, when the first region comprises the first MAX phase PC3:

depositing chromium or a chromium alloy on the thermal barrier, the deposit being made by a spray technique, by a vapour phase deposition technique, by sol-gel route or electrophoresis, depositing the second MAX phase of formula $Ti_3AlC_2$ on the previously deposited chromium or chromium alloy, the deposit being made by a spray technique, by a vapour phase deposition technique, by sol-gel route or electrophoresis, and a heat treatment for chromium diffusion into the second MAX phase of formula $Ti_3AlC_2$ by imposing a temperature greater than or equal to 900° C. in order to obtain the coated part.

* * * * *